United States Patent
Kato et al.

(10) Patent No.: US 12,020,913 B2
(45) Date of Patent: Jun. 25, 2024

(54) TEMPERATURE REGULATOR AND SUBSTRATE TREATMENT APPARATUS

(71) Applicant: Tokyo Electron Limited, Tokyo (JP)

(72) Inventors: Makoto Kato, Miyagi (JP); Sho Murano, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 284 days.

(21) Appl. No.: 17/524,755

(22) Filed: Nov. 12, 2021

(65) Prior Publication Data
US 2022/0157578 A1 May 19, 2022

(30) Foreign Application Priority Data
Nov. 13, 2020 (JP) .................................. 2020-189065

(51) Int. Cl.
*H01J 37/32* (2006.01)
(52) U.S. Cl.
CPC .............................. *H01J 37/32724* (2013.01)
(58) Field of Classification Search
CPC ............... H01L 21/683; H01L 21/6831; H01L 21/67109; H01L 21/3065; H01J 37/32715; H01J 37/3299; H01J 37/32724; H01J 2237/002; H01J 37/32798
USPC ............................................................ 165/65
See application file for complete search history.

(56) References Cited

U.S. PATENT DOCUMENTS

2004/0163601 A1* 8/2004 Kadotani .......... H01J 37/32724
118/728

FOREIGN PATENT DOCUMENTS

| JP | 2014-150104 A | 8/2014 |
| JP | 2019-121748 A | 7/2019 |

* cited by examiner

*Primary Examiner* — Steve S Tanenbaum
(74) *Attorney, Agent, or Firm* — XSENSUS LLP

(57) ABSTRACT

A temperature regulator includes a first member, a channel, and a cavity. The first member has a first surface that is subjected to temperature control. The channel is along the first surface in the first member, and refrigerant flows in the channel. The cavity is provided in the first member adjacently to a flow rate change region of the channel. A flow rate of refrigerant in the flow rate change region is higher than a flow rate of refrigerant in another region of the channel.

18 Claims, 6 Drawing Sheets

TEMPERATURE REGULATOR AND SUBSTRATE TREATMENT APPARATUS

CROSS-REFERENCE TO RELATED APPLICATIONS

The present application claims priority to JP 2020-189065, filed in Japan on Nov. 13, 2020, the contents of which is incorporated by reference in its entirety.

BACKGROUND

1. Technology Field

The present disclosure relates to a temperature regulator and a substrate processing apparatus.

2. Description of the Related Art

A conventional substrate processing apparatus cools a substrate by flowing refrigerant through a channel provided in a stage in order to regulate the temperature of the substrate placed on a placement surface of the stage.

SUMMARY

A temperature regulator according to an aspect of the present disclosure includes a first member, a channel, and a cavity. The first member has a first surface that is subjected to temperature control. The channel is along the first surface in the first member, and refrigerant flows in the channel. The cavity is provided in the first member adjacently to a flow rate change region of the channel. A flow rate of refrigerant in the flow rate change region is higher than a flow rate of refrigerant in another region of the channel.

DETAILED DESCRIPTION OF THE DRAWINGS

Hereinafter, an embodiment of a temperature regulator and a substrate processing apparatus disclosed in the present application will be described in detail with reference to the attached drawings. The present embodiment does not limit the temperature regulator or the substrate processing apparatus disclosed.

Incidentally, in a substrate processing apparatus, a region in which the flow rate of refrigerant is locally high occurs in part of a channel formed in a stage. The flow rate of refrigerant is locally high in regions, for example, an inlet portion at which an inlet of refrigerant is provided, a bending portion having a large curvature, a connection portion connecting two channels having different sectional areas, an outlet portion at which an outlet of refrigerant is provided, and the like, in the channel in the stage. In the substrate processing apparatus, when the flow rate of refrigerant is locally high in a region that is part of the channel in the stage, heat exchange between refrigerant and a placement surface is locally facilitated, a temperature singular point occurs in the plane of the placement surface, and temperature uniformity may decrease in the plane of the placement surface. A decrease in temperature uniformity in the plane of the placement surface unfavorably becomes a factor for causing a temperature difference in a substrate on the placement surface.

For this reason, devices in accordance with the present disclosure may improve in-plane temperature uniformity.

Embodiment

Configuration of Substrate Processing Apparatus

Figure 1:
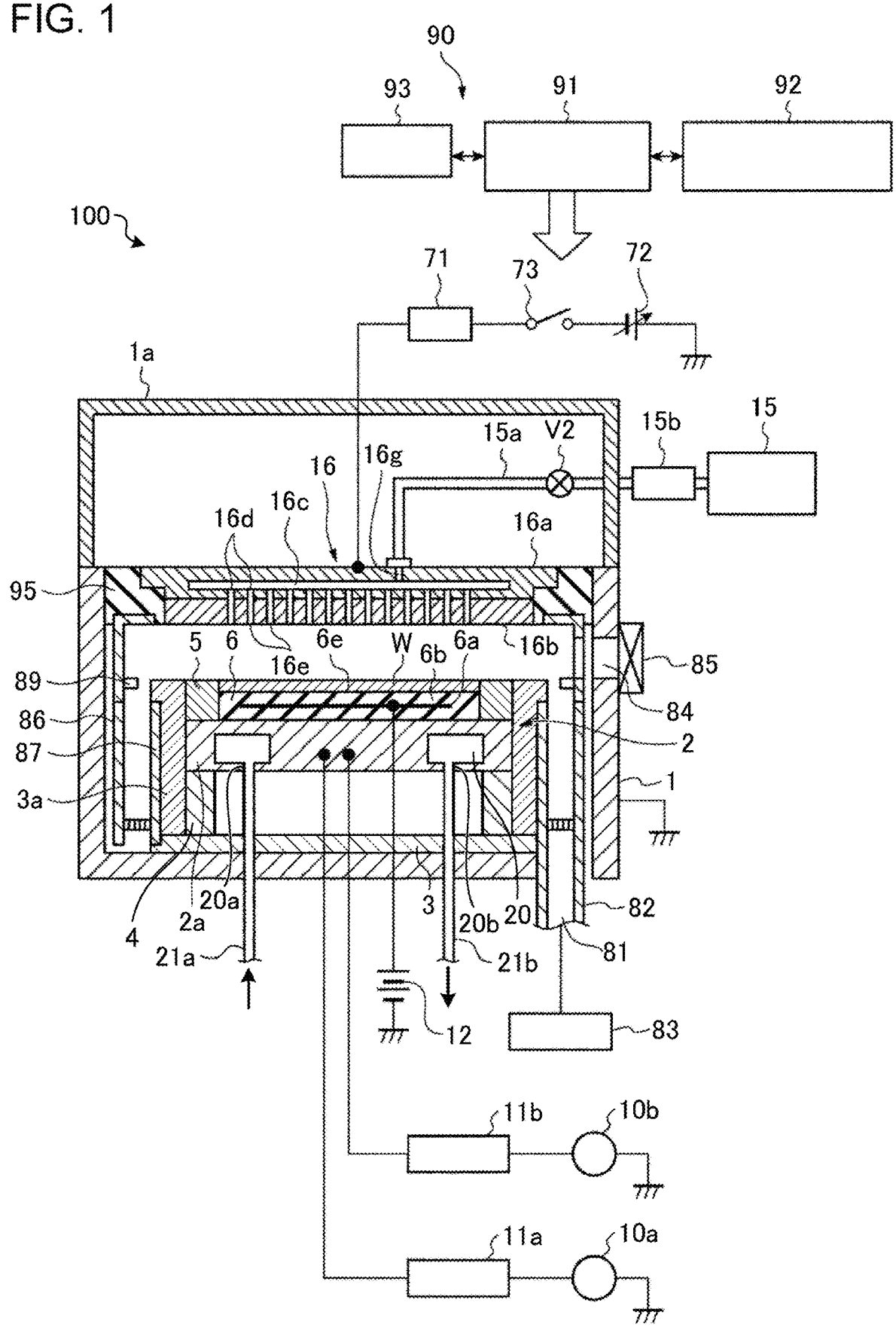
FIG. 1 is a schematic sectional view showing the configuration of a substrate processing apparatus according to an embodiment.

FIG. 1 is a schematic sectional view showing the configuration of a substrate processing apparatus 100 according to an embodiment. In the present embodiment, the case where the substrate processing apparatus 100 is a plasma processing apparatus including parallel plate electrodes will be described as an example. The substrate processing apparatus 100 includes a processing chamber 1 configured to be airtight and set to an electrically ground potential. The processing chamber 1 has a cylindrical shape and is made of, for example, aluminum or the like. The processing chamber 1 defines a processing space in which plasma is generated. A stage 2 is provided inside the processing chamber 1. The stage 2 horizontally supports a semiconductor wafer (hereinafter, simply referred to as wafer) W that is a substrate. In the present embodiment, the stage 2 corresponds to a temperature regulator.

The stage 2 includes a base 2a and an electrostatic chuck (ESC) 6. The base 2a is made of an electrically conductive metal, for example, aluminum or the like. The base 2a functions as a lower electrode. The electrostatic chuck 6 has a function for electrostatically attracting a wafer W. The stage 2 is supported by a support 4. The support 4 is supported by a supporting member 3 made of, for example, quartz or the like. A focus ring 5 is provided at the outer periphery on the stage 2. The focus ring 5 is made of, for example, monocrystal silicon. A cylindrical inner wall member 3a is provided inside the processing chamber 1 so as to surround the stage 2 and the support 4. The inner wall member 3a is made of, for example, quartz or the like.

A first RF power supply 10a is connected to the base 2a via a first matcher 11a. A second RF power supply 10b is connected to the base 2a via a second matcher 11b. The first RF power supply 10a is used to generate plasma. The first RF power supply 10a supplies radio-frequency power with a predetermined frequency to the base 2a of the stage 2. The second RF power supply 10b is used to attract (to bias) ions. The second RF power supply 10b supplies radio-frequency power with a predetermined frequency lower than the predetermined frequency of the first RF power supply 10a to the base 2a of the stage 2. In this way, the stage 2 is configured such that two radio-frequency powers with different frequencies can be respectively applied from the first RF power supply 10a and the second RF power supply 10b. On the other hand, a shower head 16 is provided above the stage 2 so as to face the stage 2 parallel. The shower head 16 functions as an upper electrode. The shower head 16 and the stage 2 function as a pair of electrodes (upper electrode and lower electrode).

The electrostatic chuck 6 is in a disc shape with a flat top surface. The top surface of the electrostatic chuck 6 serves as a placement surface 6e on which a wafer W is placed. The electrostatic chuck 6 is made by interposing an electrode 6a in an electrical insulator 6b. A direct-current power supply 12 is connected to the electrode 6a. The electrostatic chuck 6 attracts a wafer W by using Coulomb force generated by applying a direct-current voltage from the direct-current power supply 12 to the electrode 6a.

A channel 20 is formed in the base 2a. A refrigerant inlet pipe 21a is connected to one end of the channel 20. A refrigerant outlet pipe 21b is connected to the other end of the channel 20. The refrigerant inlet pipe 21a and the refrigerant outlet pipe 21b are connected to a chiller unit (not shown). The channel 20 is located below the wafer W and functions to absorb heat of the wafer W. The substrate processing apparatus 100 is configured to be capable of controlling the stage 2 to a predetermined temperature by circulating refrigerant, for example, coolant, an organic solvent, such as Galden, or the like through the channel 20 from the chiller unit via the refrigerant inlet pipe 21a and the refrigerant outlet pipe 21b.

The substrate processing apparatus 100 may be configured to be capable of individually controlling temperature by supplying heat transfer gas to the back surface side of the wafer W. For example, a gas supply pipe for supplying heat transfer gas (back side gas), such as gaseous helium, to the back surface of the wafer W may be provided so as to extend through the stage 2 and the like. The gas supply pipe is connected to a gas supply source (not shown). With these configurations, the wafer W attracted and held by the electrostatic chuck 6 on the top surface of the stage 2 is controlled to a predetermined temperature.

The shower head 16 is provided at the top wall portion of the processing chamber 1. The shower head 16 includes a body portion 16a and an upper top plate 16b serving as an electrode plate. The shower head 16 is supported at the upper part of the processing chamber 1 via an electrically insulating member 95. The body portion 16a is made of an electrically conductive material, for example, aluminum having a surface with anodic treatment. The body portion 16a is configured to be able to detachably support the upper top plate 16b at its lower part.

A gas diffusion chamber 16c is provided in the body portion 16a. A large number of gas communication holes 16d are formed at the bottom of the body portion 16a so as to be located under the gas diffusion chamber 16c. Gas introduction holes 16e are provided in the upper top plate 16b so as to extend through the upper top plate 16b in the thickness direction. The gas introduction holes 16e are provided so as to overlap the gas communication holes 16d. With the above configuration, processing gas supplied to the gas diffusion chamber 16c is supplied into the processing chamber 1 via the gas communication holes 16d and the gas introduction holes 16e so as to be dispersed in a shower.

A gas inlet 16g for introducing processing gas to the gas diffusion chamber 16c is formed in the body portion 16a. One end of a gas supply pipe 15a is connected to the gas inlet 16g. A processing gas supply source 15 is connected to the other end of the gas supply pipe 15a. The processing gas supply source 15 supplies processing gas. A mass flow controller (MFC) 15b and an on-off valve V2 are provided in the gas supply pipe 15a in order from the upstream side. Processing gas for plasma etching is supplied from the processing gas supply source 15 to the gas diffusion chamber 16c via the gas supply pipe 15a. Processing gas is supplied from the gas diffusion chamber 16c into the processing chamber 1 via the gas communication holes 16d and the gas introduction holes 16e so as to be dispersed in a shower.

A variable direct-current power supply 72 is electrically connected to the shower head 16 via a low pass filter (LPF) 71. The variable direct-current power supply 72 is configured to be capable of turning on or off supply of electric power with an on-off switch 73. The current and voltage of the variable direct-current power supply 72 and the on or off state of the on-off switch 73 are controlled by a control unit 90 (described later). When plasma is generated in the processing space by applying radio-frequency power from the first RF power supply 10a and the second RF power supply 10b to the stage 2, the on-off switch 73 is turned on by the control unit 90 as needed, and a predetermined direct-current voltage is applied to the shower head 16.

A cylindrical ground conductor 1a is provided so as to extend from the side wall of the processing chamber 1 to above a position corresponding to the level of the shower head 16. The cylindrical ground conductor 1a has a top wall at its upper part.

The bottom of the processing chamber 1 has an exhaust outlet 81. A first exhaust apparatus 83 is connected to the exhaust outlet 81 via an exhaust pipe 82. The first exhaust apparatus 83 has a vacuum pump. The first exhaust apparatus 83 is configured to be capable of decompressing the inside of the processing chamber 1 to a predetermined degree of vacuum by operating the vacuum pump. On the other hand, a carry-in/carry-out opening 84 for a wafer W is provided at the side wall of the processing chamber 1. A gate valve 85 that opens or closes the carry-in/carry-out opening 84 is provided at the carry-in/carry-out opening 84.

A deposit shield 86 is provided inside the side of the processing chamber 1 along an inner wall surface. The deposit shield 86 prevents adhesion of an etching by-product (deposit) to the processing chamber 1. An electrically conductive member (GND block) 89 connected such that a potential with respect to a ground is controllable is provided on the deposit shield 86 at substantially the same level as the wafer W. Thus, abnormal discharge is prevented. A deposit shield 87 extending along the inner wall member 3a is provided at the lower end of the deposit shield 86. The deposit shields 86, 87 are detachable.

The operation of the thus configured substrate processing apparatus 100 is generally controlled by the control unit 90. The control unit 90 includes a process controller 91, a user interface 92, and a storage unit 93. The process controller 91 includes a CPU and controls the portions of the substrate processing apparatus 100.

The user interface 92 is made up of a keyboard for a process manager to input commands to manage the substrate processing apparatus 100, a display that visualizes and displays the operational status of the substrate processing apparatus 100, and the like.

The storage unit 93 stores recipes containing control programs (software), process condition data, and the like for implementing various processes to be performed in the substrate processing apparatus 100 through control of the process controller 91. Where necessary, a selected recipe is called from the storage unit 93 with an instruction or the like from the user interface 92, and the process controller 91 is caused to run the recipe. Thus, under control of the process controller 91, a desired process is performed in the substrate processing apparatus 100. Recipes containing control programs and process condition data, stored in a computerreadable computer storage medium (for example, a hard disk, a CD, a flexible disk, a semiconductor memory, or the like) or the like can be used or recipes can be transferred as needed from another apparatus via, for example, a dedicated line and used online.

Configuration of Stage

Figure 2:
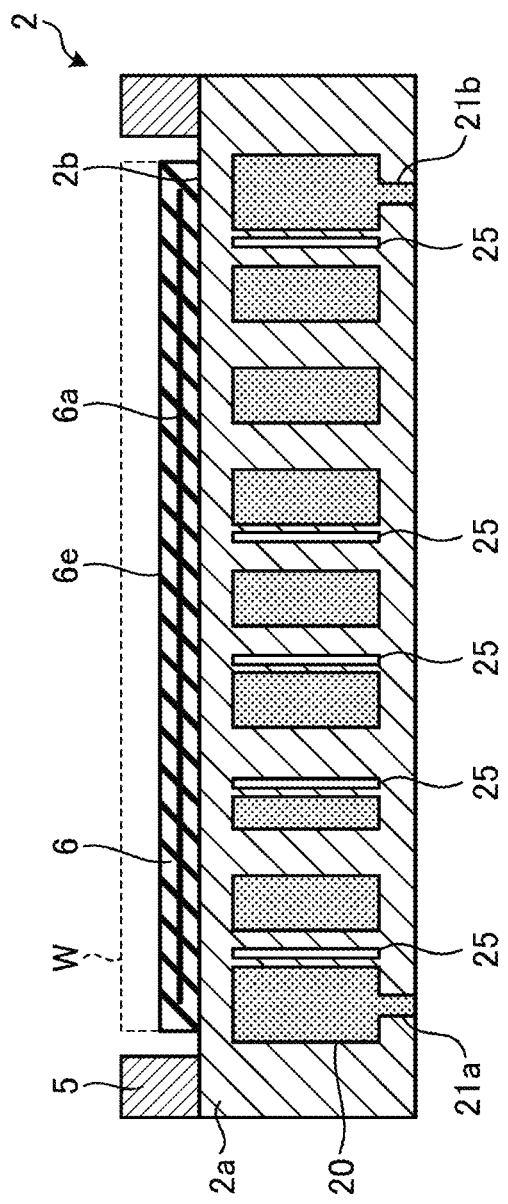
FIG. 2 is a schematic sectional view showing the main part configuration of a stage according to the embodiment.

Next, the main part configuration of the stage 2 will be described with reference to FIG. 2. FIG. 2 is a schematic sectional view showing the main part configuration of the stage 2 according to the embodiment.

The stage 2 includes the base 2a and the electrostatic chuck 6. The electrostatic chuck 6 is formed in a disc shape. The electrostatic chuck 6 is provided on a top surface 2b of the base 2a. The top surface of the electrostatic chuck 6 serves as the placement surface 6e on which a wafer W is placed. The entire bottom surface of the electrostatic chuck 6 on a side across from the placement surface 6e is formed in a flat shape. On the other hand, the entire top surface 2b of the base 2a is similarly formed in a flat shape. The electrostatic chuck 6 is fixed on the top surface 2b of the base 2a via a bonding layer so as to be coaxial with the base 2a.

The channel 20 is formed in the base 2a along the placement surface 6e. The substrate processing apparatus 100 is configured to be capable of controlling the temperature of the stage 2 by flowing refrigerant through the channel 20.

Incidentally, in the substrate processing apparatus 100, regions (hereinafter, referred to as flow rate change regions) in which the flow rate of refrigerant is higher than the flow rate in the other regions occur in part of the channel 20 in the stage 2. In the substrate processing apparatus 100, when the flow rate of refrigerant is locally high in the flow rate change region of the channel 20, heat exchange between refrigerant and the placement surface 6e is locally facilitated, a temperature singular point occurs in the plane of the placement surface 6e, and temperature uniformity may decrease in the plane of the placement surface 6e. A decrease in temperature uniformity in the plane of the placement surface 6e unfavorably becomes a factor for causing a temperature difference in the wafer W on the placement surface 6e.

For this reason, in the substrate processing apparatus 100 according to the embodiment, a cavity 25 that does not communicate with the channel 20 is provided in the stage 2 adjacently to each of the flow rate change regions of the channel 20. The cavities 25 have the function of increasing thermal resistance between the channel 20 and the top surface 2b of the base 2a. Each of the cavities 25 is, for example, provided laterally to an associated one of the flow rate change regions of the channel 20. In this case, a ceiling surface of each cavity 25 on a side of the top surface 2b of the base 2a and a bottom surface of the cavity 25 on a side across from the top surface 2b are respectively equal in level to a ceiling surface of the channel 20 on a side of the top surface 2b of the base 2a and a bottom surface of the channel 20 on a side across from the top surface 2b.

Arrangement of Channel and Cavities

Figure 3:
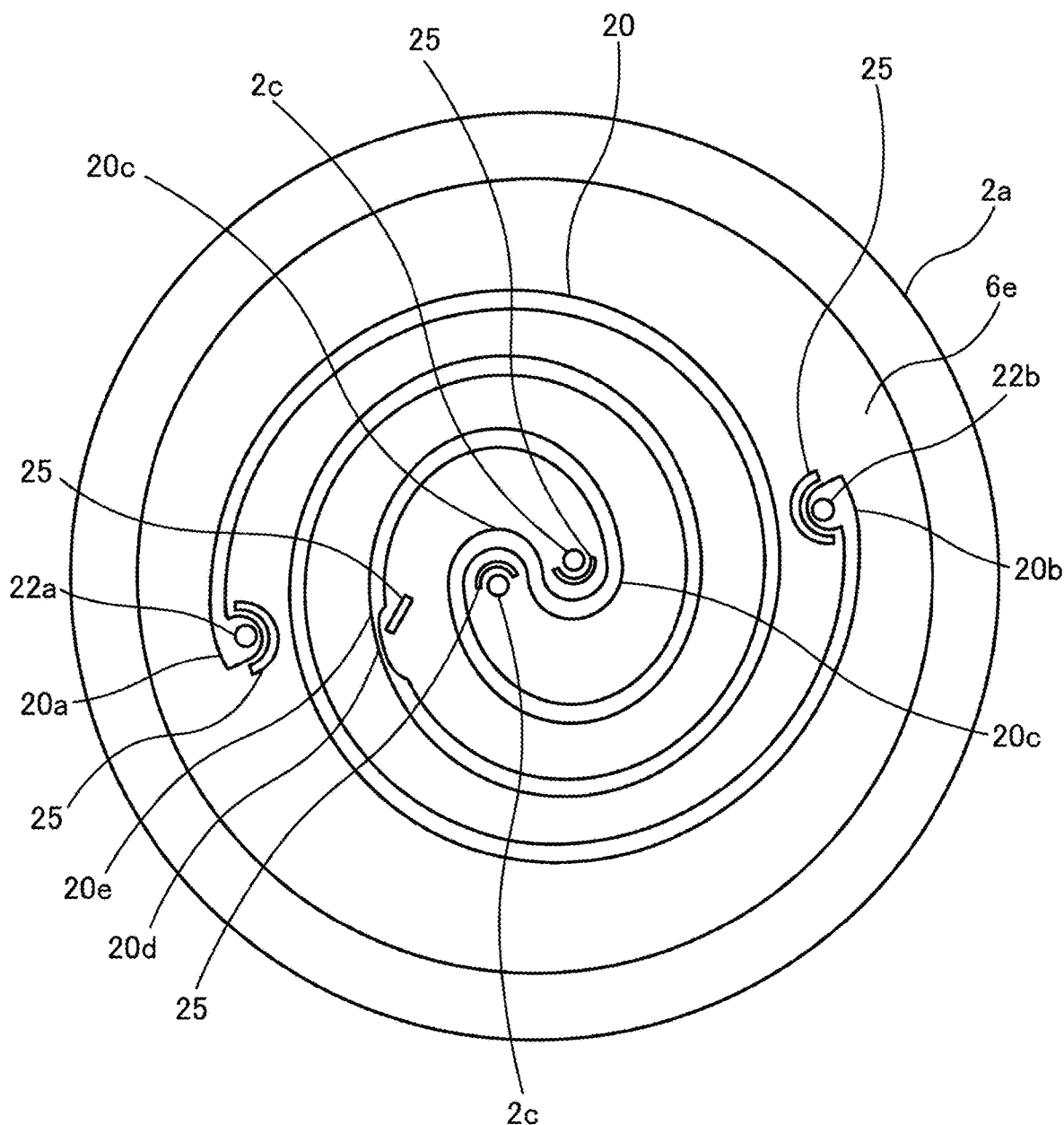
FIG. 3 is a plan view showing an example of the configuration of the stage according to the embodiment when viewed from above.

Next, an example of arrangement of the channel 20 and cavities 25 of the stage 2 will be described. FIG. 3 is a plan view showing an example of the configuration of the stage 2 according to the embodiment when viewed from above. In FIG. 3, the placement surface 6e of the stage 2 is shown in a disc shape. The channel 20 is formed in a spiral shape in a region corresponding to the placement surface 6e in the base 2a. An inlet portion 20a for refrigerant is formed at one end of the channel 20. An outlet portion 20b for refrigerant is formed at the other end of the channel 20. An inlet 22a for introducing refrigerant is provided at the bottom surface of the inlet portion 20a. An outlet 22b for discharging refrigerant is provided at the bottom surface of the outlet portion 20b. The inlet 22a is connected to the refrigerant inlet pipe 21a. The outlet 22b is connected to the refrigerant outlet pipe 21b. In the channel 20, refrigerant introduced from the refrigerant inlet pipe 21a to the inlet portion 20a via the inlet 22a passes through the inside of the channel 20, and refrigerant having passed through the inside is discharged from the outlet portion 20b to the refrigerant outlet pipe 21b via the outlet 22b. At the inlet portion 20a and the outlet portion 20b of the channel 20, the flow rate of refrigerant is locally high due to a change in the flow direction of refrigerant. In other words, the inlet portion 20a and the outlet portion 20b of the channel 20 each can be a flow rate change region.

For example, as shown in FIG. 3, the cavities 25 are respectively individually provided in the base 2a adjacently to the inlet portion 20a and the outlet portion 20b. In the present embodiment, the cavity 25 is provided laterally to the inlet portion 20a. Specifically, the cavity 25 is provided so as to surround the inlet portion 20a. In the present embodiment, the cavity 25 is provided laterally to the outlet portion 20b. Specifically, the cavity 25 is provided so as to surround the outlet portion 20b.

Local bending portions 20c each having a greater curvature than the other bending portions are formed in an area between the inlet portion 20a and the outlet portion 20b of the channel 20. Through-holes 2c are formed in the base 2a and extend through the top surface 2b in an up and down direction. Each of the local bending portions 20c is, for example, bent so as to bypass the through-hole 2c. The through-holes 2c are holes in which, for example, a gas supply pipe for supplying heat transfer gas to the back surface side of the wafer W, a wire that connects the electrode 6a of the electrostatic chuck 6 to the direct-current power supply 12, a lifter pin for lifting or lowering the wafer W, and/or the like is disposed. At each of the local bending portions 20c of the channel 20, the flow rate of refrigerant is locally high due to a change in the flow direction of refrigerant. In other words, the local bending portions 20c of the channel 20 each can be a flow rate change region.

For example, as shown in FIG. 3, the cavity 25 is provided in the base 2a adjacently to each of the local bending portions 20c. In the present embodiment, the cavity 25 is provided laterally to each of the local bending portions 20c. Specifically, the cavity 25 is provided on the inner surface side of each of the local bending portions 20c. The cavity 25 may be provided on the inner surface side and outer surface side of each of the local bending portions 20c.

A narrow channel portion 20d less in sectional area or width than the other channel portion and a connection portion 20e that connects the narrow channel portion 20d and the other channel portion are formed in an area between the inlet portion 20a and the outlet portion 20b of the channel 20. At the connection portion 20e of the channel 20, the flow rate of refrigerant is locally high due to narrowing the range of flow of refrigerant. In other words, the connection portion 20e of the channel 20 can be a flow rate change region.

For example, as shown in FIG. 3, the cavity 25 is provided in the base 2a adjacently to the connection portion 20e. In the present embodiment, the cavity 25 is provided laterally to the connection portion 20e. The cavity 25 may be provided on each side of the connection portion 20e.

In this way, the substrate processing apparatus 100 locally increases thermal resistance between the channel 20 and the top surface 2b of the base 2a by providing the cavity 25 in the stage 2 adjacently to each of the flow rate change regions of the channel 20. Thus, the stage 2 is able to reduce occurrence of a temperature singular point in the plane of the top surface 2b, so temperature uniformity in the plane of the top surface 2b is improved. As a result, the stage 2 improves temperature uniformity in the plane of the placement surface 6e.

The cavity 25 does not need to be provided adjacently to each of the inlet portion 20a, the local bending portions 20c, the connection portion 20e, and the outlet portion 20b that are the flow rate change regions of the channel 20. In other words, the cavity 25 may be individually provided in the base 2a adjacently to at least one of the inlet portion 20a, the local bending portions 20c, the connection portion 20e, and the outlet portion 20b.

Figure 4:
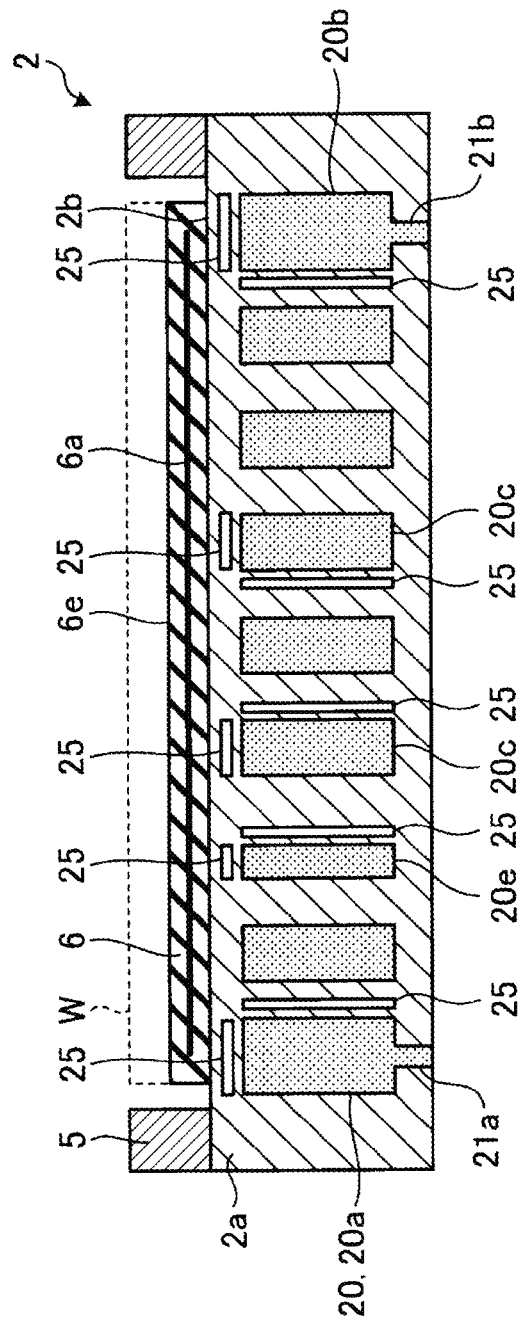
FIG. 4 is a view schematically showing another example of arrangement of cavities according to the embodiment.

The cavity 25 may be provided not only laterally to the flow rate change region of the channel 20 but also above the flow rate change region of the channel 20. FIG. 4 is a view schematically showing another example of arrangement of the cavities 25 according to the embodiment. In FIG. 4, another example in which the cavity 25 is provided not only laterally to each of the flow rate change regions of the channel 20 but also above each of the flow rate change regions of the channel 20 is shown. The cavity 25 is provided between the inlet portion 20a of the channel 20 and the top surface 2b of the base 2a. The cavity 25 is provided between each local bending portion 20c and the top surface 2b of the base 2a. The cavity 25 is provided between the connection portion 20e and the top surface 2b of the base 2a. The cavity 25 is provided between the outlet portion 20b and the top surface 2b of the base 2a. Thus, it is possible to efficiently increase thermal resistance between each flow rate change region of the channel 20 and the top surface 2b of the base 2a.

Figure 5:
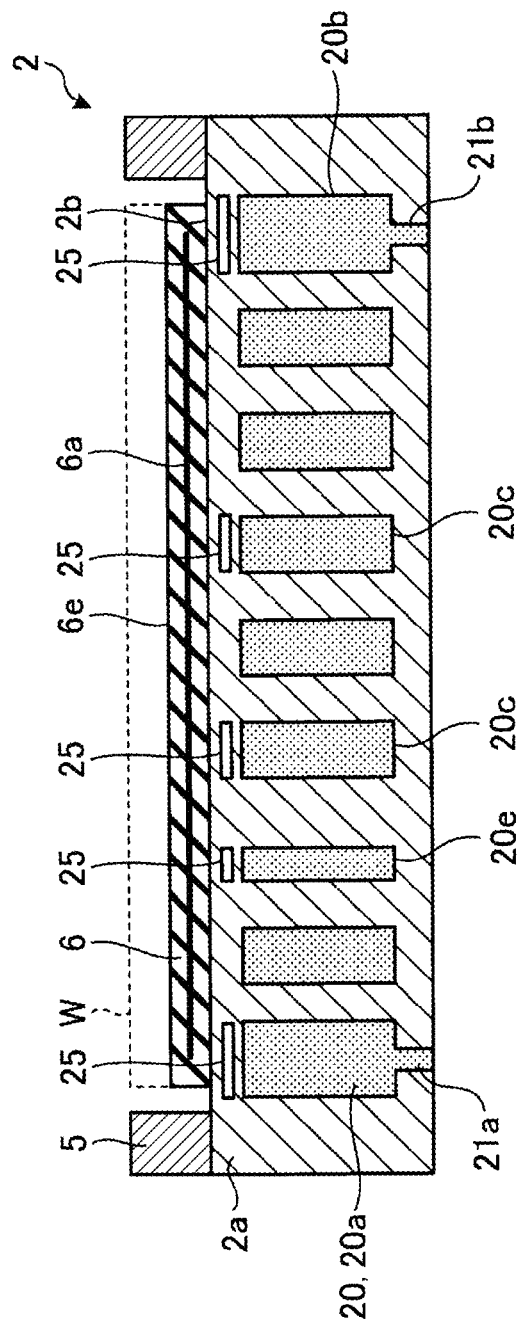
FIG. 5 is a view schematically showing another example of arrangement of cavities according to the embodiment.

The cavity 25 may be provided only above each of the flow rate change regions of the channel 20. FIG. 5 is a view schematically showing another example of arrangement of the cavities 25 according to the embodiment. In other words, as shown in FIG. 5, the cavity 25 is not provided laterally to each of the flow rate change regions of the channel 20 and provided only above each of the flow rate change regions of the channel 20.

Figure 6:
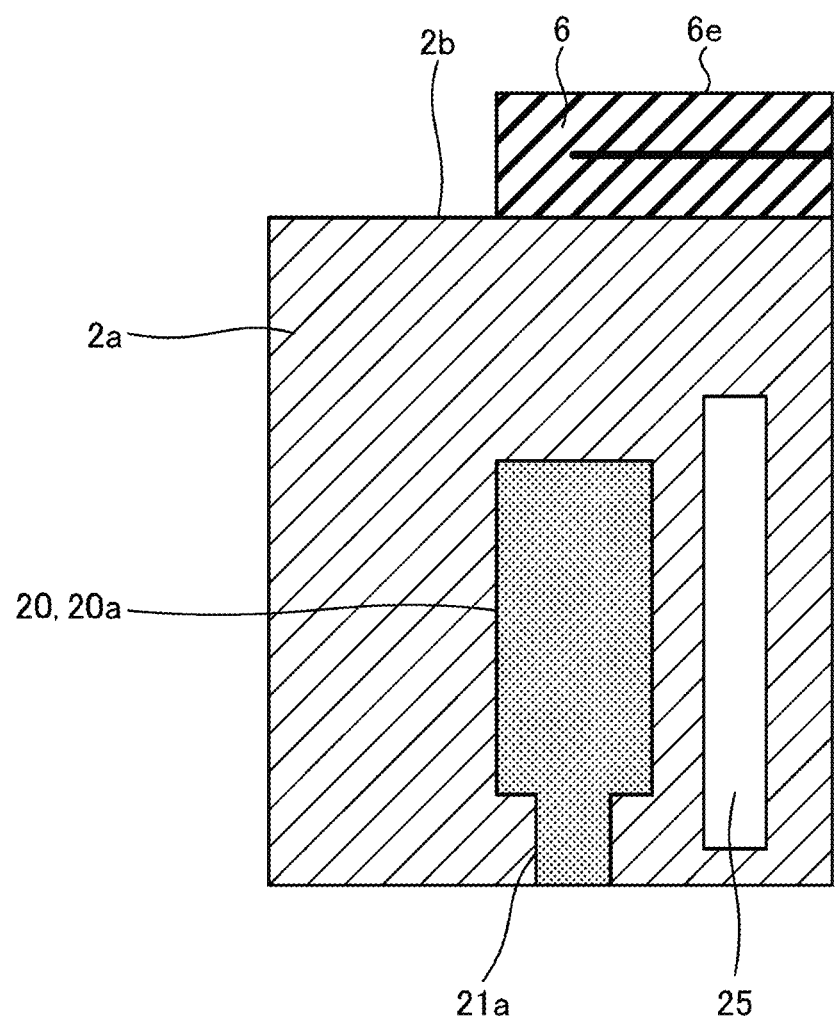
FIG. 6 is a view showing an example of the levels of a ceiling surface and a bottom surface of a cavity according to the embodiment.

When the cavity 25 is provided laterally to each of the flow rate change regions of the channel 20, the levels of the ceiling surface and bottom surface of the cavity 25 may be different from the levels of the ceiling surface and bottom surface of the channel 20. FIG. 6 is a view showing an example of the levels of the ceiling surface and bottom surface of the cavity 25 according to the embodiment. The ceiling surface of the cavity 25 on a side of the top surface 2b of the base 2a is higher in level than the ceiling surface of the channel 20 on a side of the top surface 2b of the base 2a. The bottom surface of the cavity 25 on a side across from the top surface 2b is lower in level than the bottom surface of the channel 20 on a side across from the top surface 2b. The ceiling surface of the cavity 25 may be equal in level to the ceiling surface of the channel 20, and the bottom surface of the cavity 25 may be lower in level than the bottom surface of the channel 20. The bottom surface of the cavity 25 may be equal in level to the bottom surface of the channel 20, and the ceiling surface of the cavity 25 may be higher in level than the ceiling surface of the channel 20.

As described above, the stage 2 according to the embodiment includes the base 2a, the channel 20, and the cavities 25. The base 2a has the top surface 2b subjected to temperature control. The channel 20 is formed in the base 2a along the top surface 2b and allows refrigerant to flow. The cavity 25 is provided in the base 2a adjacently to each of the flow rate change regions of the channel 20, in which the flow rate of refrigerant is higher than the flow rate of refrigerant in the other region. Thus, the stage 2 improves temperature uniformity in the plane of the top surface 2b. As a result, the stage 2 improves temperature uniformity in the plane of the placement surface 6e on which the wafer W is placed, so a temperature difference in the plane of the wafer W is reduced.

The flow rate change region of the channel 20 according to the embodiment may be at least one of the inlet portion 20a, the local bending portions 20c, the connection portion 20e, and the outlet portion 20b. The cavity 25 may be individually provided in the base 2a adjacently to at least one of the inlet portion 20a, the local bending portions 20c, the connection portion 20e, and the outlet portion 20b. Thus, the stage 2 reduces occurrence of temperature singular point in a region corresponding to at least one of the inlet portion 20a, local bending portions 20c, connection portion 20e, and outlet portion 20b of the top surface 2b.

The cavity 25 according to the embodiment may be provided laterally to the inlet portion 20a. The cavity 25 may be provided so as to surround the inlet portion 20a. Thus, the stage 2 locally increases thermal resistance between the inlet portion 20a and the top surface 2b and reduces occurrence of temperature singular point in a region corresponding to the inlet portion 20a of the top surface 2b.

The cavity 25 according to the embodiment may be provided between the inlet portion 20a and the top surface 2b. Thus, the stage 2 efficiently increases thermal resistance between the inlet portion 20a and the top surface 2b.

The cavity 25 according to the embodiment may be provided laterally to each of the local bending portions 20c. Thus, the stage 2 locally increases thermal resistance between each local bending portion 20c and the top surface 2b and reduces occurrence of temperature singular point in a region corresponding to each local bending portion 20c of the top surface 2b.

The base 2a according to the embodiment may have the through-holes 2c extending through the top surface 2b in the up and down direction. Each of the local bending portions 20c may be bent so as to bypass the through-hole 2c. The cavity 25 may be provided on the inner surface side of each of the local bending portions 20c. Thus, the stage 2 locally increases thermal resistance between the inner surface of each local bending portion 20c and the top surface 2b.

The cavity 25 according to the embodiment may be provided laterally to the connection portion 20e. Thus, the stage 2 locally increases thermal resistance between the connection portion 20e and the top surface 2b and reduces occurrence of temperature singular point in a region corresponding to the connection portion 20e of the top surface 2b.

The cavity 25 according to the embodiment may be provided between the connection portion 20e and the top surface 2b. Thus, the stage 2 efficiently increases thermal resistance between the connection portion 20e and the top surface 2b.

The cavity 25 according to the embodiment may be provided laterally to the outlet portion 20b. The cavity 25 may be provided so as to surround the outlet portion 20b. Thus, the stage 2 locally increases thermal resistance between the outlet portion 20b and the top surface 2b and reduces occurrence of temperature singular point in a region corresponding to the outlet portion 20b of the top surface 2b.

The cavity 25 according to the embodiment may be provided between the outlet portion 20b and the top surface 2b. Thus, the stage 2 efficiently increases thermal resistance between the outlet portion 20b and the top surface 2b.

The cavity 25 according to the embodiment may be provided laterally to each of the flow rate change regions of the channel 20. In this case, the ceiling surface of the cavity 25 on a side of the top surface 2b and the bottom surface of the cavity 25 on a side across from the top surface 2b may be equal in level to the ceiling surface of the channel 20 on a side of the top surface 2b and the bottom surface of the channel 20 on a side across from the top surface 2b.

The ceiling surface of the cavity 25 on a side of the top surface 2b may be higher in level than the ceiling surface of the channel 20 on a side across from the top surface 2b. The bottom surface of the cavity 25 on a side across from the top surface 2b may be lower than the bottom surface of the channel 20 on a side across from the top surface 2b. Thus, the stage 2 further efficiently increases thermal resistance between each flow rate change region and the top surface 2b.

The stage 2 according to the embodiment may further include the electrostatic chuck 6. The electrostatic chuck 6 may be provided on the top surface 2b of the base 2a and may have the placement surface 6e on which a wafer W is placed. The entire top surface 2b of the base 2a and the entire bottom surface of the electrostatic chuck 6 on a side across from the placement surface 6e each may be formed in a flat shape. The electrostatic chuck 6 may be fixed to the top surface 2b of the base 2a via the bonding layer. Thus, the stage 2 improves uniformity of heat transfer between the electrostatic chuck 6 and the base 2a.

The embodiment is described above; however, the embodiment described above should be regarded as illustrative and not restrictive in all respects. Actually, the embodiment can be implemented in various modes. The embodiment may be omitted, replaced, or changed in various modes without departing from the scope and spirit of the invention.

For example, in the above-described embodiment, the case where the stage 2 serves as a temperature regulator as an example and in-plane temperature uniformity is improved for the wafer W, the placement surface 6e, and the top surface 2b of the base 2a is described as an example. However, the configuration is not limited thereto. A temperature regulator may be applied to another portion of the substrate processing apparatus 100. For example, to cool the shower head 16 that is the upper electrode, the substrate processing apparatus 100 may regulate the temperature by providing a channel in the shower head 16 and circulating refrigerant through the channel. For example, in the body portion 16a of the shower head 16, the bottom surface is formed in a flat shape, and a channel is provided along the bottom surface. In this case, the shower head 16 corresponds to a temperature regulator. The substrate processing apparatus 100 is configured to be capable of controlling the temperature of the shower head 16 by flowing refrigerant through the channel in the body portion 16a. A flow rate change region occurs in part of the channel in the body portion 16a. The cavity 25 of the embodiment may be provided adjacently to the flow rate change region of the channel in the body portion 16a. Thus, the shower head 16 improves temperature uniformity in the plane of the bottom surface of the body portion 16a, with the result that temperature uniformity in the plane of the shower head 16 is improved.

What is claimed is:

1. A temperature regulator, comprising:
   a first member having a first surface subjected to temperature control;
   a channel, along the first surface in the first member, in which refrigerant flows; and
   a cavity provided in the first member adjacently to a flow rate change region of the channel, wherein
   a flow rate of refrigerant in the flow rate change region is higher than a flow rate of refrigerant in another region of the channel,
   the flow rate change region of the channel is a local bending portion of which a curvature is greater than a curvature of another bending portion, and the cavity is individually provided in the first member adjacently to the local bending portion, and
   the cavity is provided laterally to the local bending portion, or between the local bending portion and the first surface.

2. The temperature regulator according to claim 1, further comprising:
   a second member provided on the first surface of the first member and having a placement surface on which a substrate is placed, wherein
   an entirety of the first surface of the first member and an entirety of a second surface of the second member on a side across from the placement surface are formed in a flat shape, and
   the second member is fixed to the first surface of the first member via a bonding layer.

3. The temperature regulator according to claim 1, wherein the cavity is provided between the local bending portion and the first surface.

4. The temperature regulator according to claim 1, wherein the cavity is provided laterally to the local bending portion.

5. The temperature regulator according to claim 4, wherein a ceiling surface of the cavity on a side of the first surface is higher in level than a ceiling surface of the channel on a side of the first surface.

6. The temperature regulator according to claim 4, wherein a bottom surface of the cavity on a side across from the first surface is lower in level than a bottom surface of the channel on a side across from the first surface.

7. The temperature regulator according to claim 4, wherein a ceiling surface of the cavity on a side of the first surface and a bottom surface of the cavity on a side across from the first surface are respectively equal in level to a ceiling surface of the channel on a side of the first surface and a bottom surface of the channel on a side across from the first surface.

8. The temperature regulator according to claim 4, wherein
   the first member has a through-hole extending through the first surface in an up and down direction,
   the local bending portion is bent so as to bypass the through-hole, and
   the cavity is provided on an inner surface side of the local bending portion.

9. A temperature regulator, comprising:
   a first member having a first surface subjected to temperature control;
   a channel, along the first surface in the first member, in which refrigerant flows; and
   a cavity provided in the first member adjacently to a flow rate change region of the channel, wherein
   a flow rate of refrigerant in the flow rate change region is higher than a flow rate of refrigerant in another region of the channel,
   the flow rate change region of the channel is a connection portion connecting a narrow channel portion having a less sectional area or width than another channel portion, to the other channel portion, and the cavity is individually provided in the first member adjacently to the connection portion, and the cavity is provided laterally to the connection portion, or between the connection portion and the first surface.

10. The temperature regulator according to claim 9, wherein the cavity is provided between the connection portion and the first surface.

11. The temperature regulator according to claim 9, further comprising:
a second member provided on the first surface of the first member and having a placement surface on which a substrate is placed, wherein
an entirety of the first surface of the first member and an entirety of a second surface of the second member on a side across from the placement surface are formed in a flat shape, and
the second member is fixed to the first surface of the first member via a bonding layer.

12. The temperature regulator according to claim 9, wherein the cavity is provided laterally to the connection portion.

13. The temperature regulator according to claim 12, wherein a ceiling surface of the cavity on a side of the first surface is higher in level than a ceiling surface of the channel on a side of the first surface.

14. The temperature regulator according to claim 12, wherein a bottom surface of the cavity on a side across from the first surface is lower in level than a bottom surface of the channel on a side across from the first surface.

15. The temperature regulator according to claim 12, wherein
a ceiling surface of the cavity on a side of the first surface and a bottom surface of the cavity on a side across from the first surface are respectively equal in level to a ceiling surface of the channel on a side of the first surface and a bottom surface of the channel on a side across from the first surface.

16. A temperature regulator, comprising:
a first member having a first surface subjected to temperature control;
a channel, along the first surface in the first member, in which refrigerant flows; and
a cavity provided in the first member adjacently to a flow rate change region of the channel, wherein
a flow rate of refrigerant in the flow rate change region is higher than a flow rate of refrigerant in another region of the channel,
the flow rate change region of the channel is an outlet portion of which a bottom surface has an outlet for discharging refrigerant, and the cavity is individually provided in the first member adjacent to the outlet portion, and
the cavity is provided laterally to the outlet portion and is provided so as to surround the outlet portion.

17. The temperature regulator according to claim 16, further comprising:
a second member provided on the first surface of the first member and having a placement surface on which a substrate is placed, wherein
an entirety of the first surface of the first member and an entirety of a second surface of the second member on a side across from the placement surface are formed in a flat shape, and
the second member is fixed to the first surface of the first member via a bonding layer.

18. The temperature regulator according to claim 16, wherein another cavity is provided between the outlet portion and the first surface.

* * * * *